(12) United States Patent
Kikuchi et al.

(10) Patent No.: US 10,205,435 B2
(45) Date of Patent: Feb. 12, 2019

(54) SURFACE ACOUSTIC WAVE DEVICE

(71) Applicant: Murata Manufacturing Co., Ltd., Nagaokakyo-shi, Kyoto-fu (JP)

(72) Inventors: Taku Kikuchi, Nagaokakyo (JP); Masahiro Fukushima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 425 days.

(21) Appl. No.: 14/941,792

(22) Filed: Nov. 16, 2015

(65) Prior Publication Data

US 2016/0079957 A1  Mar. 17, 2016

Related U.S. Application Data

(63) Continuation of application No. PCT/JP2014/063447, filed on May 21, 2014.

(30) Foreign Application Priority Data

May 27, 2013 (JP) .................. 2013-110688
Sep. 13, 2013 (JP) .................. 2013-189972

(51) Int. Cl.
*H03H 9/02* (2006.01)
*H03H 9/25* (2006.01)
(Continued)

(52) U.S. Cl.
CPC .......... *H03H 9/25* (2013.01); *H03H 9/02574* (2013.01); *H03H 9/02834* (2013.01);
(Continued)

(58) Field of Classification Search
CPC .......... H03H 9/02897; H03H 9/02992; H03H 9/02574; H03H 9/02929; H03H 9/02525;
(Continued)

(56) References Cited

U.S. PATENT DOCUMENTS 7,005,947 B2 * 2/2006 Iwashita ............ H03H 9/02574
310/313 A
2002/0101304 A1  8/2002 Onishi et al.
(Continued)

FOREIGN PATENT DOCUMENTS

JP  54-118150 A   9/1979
JP  11-88101 A    3/1999
(Continued)

OTHER PUBLICATIONS

Official Communication issued in corresponding Japanese Patent Application No. 2015-519811, dated Feb. 21, 2017.
(Continued)

*Primary Examiner* — Derek Rosenau
(74) *Attorney, Agent, or Firm* — Keating & Bennett, LLP (57) ABSTRACT

A surface acoustic wave device includes a piezoelectric substrate, a dielectric film, IDT electrodes, and a resin member. The surface acoustic wave device includes a resin contact region where the piezoelectric substrate and the resin member are in direct contact with each other. The resin contact region has a shape surrounding the IDT electrodes. Because the resin member exhibits a strong adhesion force with respect to the piezoelectric substrate, peeling-off between the piezoelectric substrate and the resin member is significantly reduced or prevented, and an airtight condition is maintained in the interior of the surface acoustic wave device.

20 Claims, 8 Drawing Sheets

(51) Int. Cl.
*H03H 9/10* (2006.01)
*H03H 9/145* (2006.01)

(52) U.S. Cl.
CPC .... *H03H 9/02897* (2013.01); *H03H 9/02992* (2013.01); *H03H 9/1071* (2013.01); *H03H 9/02559* (2013.01); *H03H 9/02929* (2013.01); *H03H 9/1042* (2013.01); *H03H 9/14541* (2013.01)

(58) Field of Classification Search
CPC . H03H 9/1071; H03H 9/1042; H03H 9/02834
USPC ...... 310/313 R, 313 A, 313 B, 313 C, 313 D
See application file for complete search history.

(56) References Cited

U.S. PATENT DOCUMENTS

| | | |
|---|---|---|
| 2004/0233020 A1 | 11/2004 | Nakamura et al. |
| 2008/0067891 A1* | 3/2008 | Matsuda ............. H03H 9/0057 310/313 R |
| 2010/0244625 A1* | 9/2010 | Fukano ................. H03H 9/059 310/313 B |
| 2011/0018389 A1* | 1/2011 | Fukano ................. H03H 9/059 310/313 R |
| 2012/0049691 A1* | 3/2012 | Kando .................... H03H 3/10 310/313 C |
| 2014/0003017 A1 | 1/2014 | Kai et al. |

FOREIGN PATENT DOCUMENTS

| | | |
|---|---|---|
| JP | 2002-261582 A | 9/2002 |
| JP | 2008-078739 A | 4/2008 |
| JP | 2010-278971 A | 12/2010 |
| JP | 2011-244065 A | 12/2011 |
| JP | 2013-065997 A | 4/2013 |
| WO | 2012/132147 A1 | 10/2012 |

OTHER PUBLICATIONS

Official Communication issued in International Patent Application No. PCT/JP2014/063447, dated Aug. 5, 2014.

* cited by examiner

FIG. 9
PRIOR ART

SURFACE ACOUSTIC WAVE DEVICE

BACKGROUND OF THE INVENTION

1. Field of the Invention

The present invention relates to a surface acoustic wave device that includes a surface acoustic wave element such as a SAW (Surface Acoustic Wave) filter or a SAW resonator, and that has a package structure surrounding the surface acoustic wave element.

2. Description of the Related Art

Figure 8:
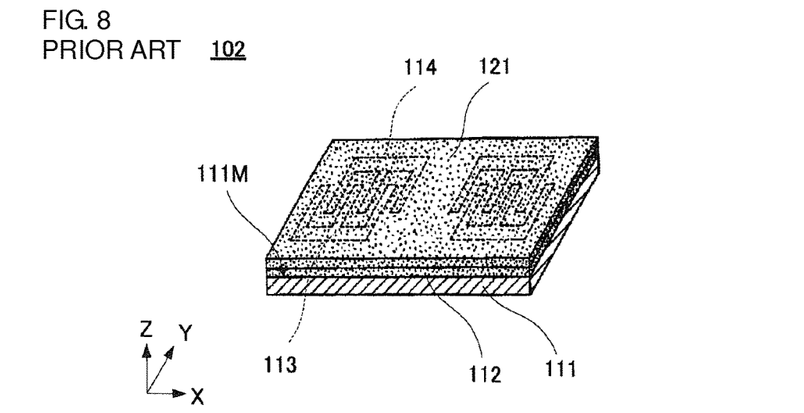
FIG. 8 is a perspective view of a surface acoustic wave element 102 disclosed in Japanese Unexamined Patent Application Publication No. 11-88101.

Japanese Unexamined Patent Application Publication No. 11-88101 describes a surface acoustic wave element 102 illustrated in FIG. 8. The surface acoustic wave element 102 includes a piezoelectric substrate 111, a dielectric film 112 disposed on the piezoelectric substrate 111, and IDT (Inter Digital Transducer) electrodes 113 and 114 both disposed on the dielectric film 112.

The dielectric film 112 is a film for adjusting a fractional bandwidth of the surface acoustic wave element 102. A material of the dielectric film 112 is a metal oxide. For example, $SiO_2$ is used as the material. From the viewpoint of ease of manufacturing, as illustrated in FIG. 8, the dielectric film 112 is formed over the entirety of a principal surface 111M of the piezoelectric substrate 111 by, e.g., sputtering. The surface acoustic wave element 102 further includes a characteristic compensating dielectric portion 121 that covers the IDT electrodes 113 and 114. The characteristic compensating dielectric portion 121 is to compensate for variations in frequency characteristics such that the frequency characteristics are not significantly changed even when the temperature of the surface acoustic wave element 102 is changed.

Figure 9:
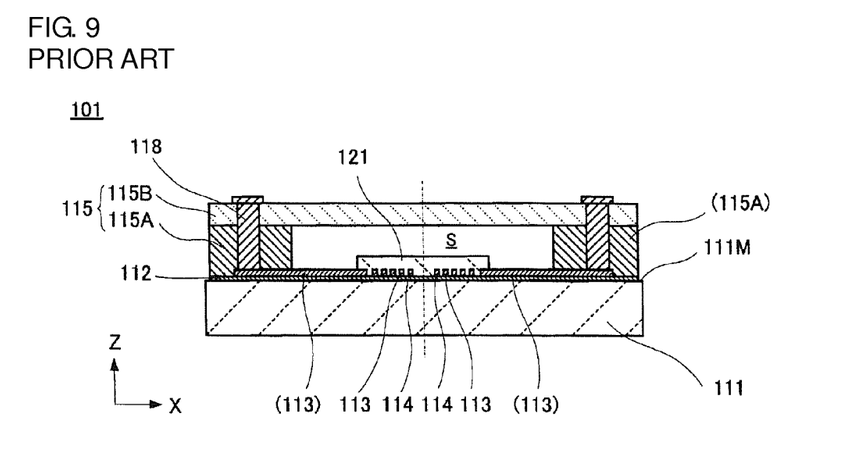
FIG. 9 is a sectional view of a surface acoustic wave device 101 including the surface acoustic wave element 102, illustrated in FIG. 8, when looked from the front (Y-direction).

FIG. 9 illustrates a surface acoustic wave device 101 including the surface acoustic wave element 102 and having a package structure. The surface acoustic wave device 101 includes, in addition to the surface acoustic wave element 102, a resin member 115 disposed on the piezoelectric substrate 111. The resin member 115 is constituted by a resin support portion 115A in the shape of a frame, and a resin cover portion 115B that is disposed in a state covering the IDT electrodes 113 and 114 in cooperation with the resin support portion 115A. The piezoelectric substrate 111 and the resin member 115 define a space S that is maintained in an airtight condition to allow excitation of a surface acoustic wave in the space. The surface acoustic wave device 101 further includes via conductors 118 through which signals are supplied to the surface acoustic wave element 102.

The piezoelectric substrate 111 is made of an inorganic piezoelectric material such as lithium niobate, and the resin member 115 is made of resin. Because the piezoelectric substrate 111 and the resin member 115 are made of different materials, their linear expansion coefficients are different from each. Therefore, when the surface acoustic wave device 101 is placed in an environment subjected to temperature variations, thermal stress is generated with expansion or contraction of the piezoelectric substrate 111 and the resin member 115.

Because the resin support portion 115A and the resin cover portion 115B of the resin member 115 are both made of resin materials and respective values of the linear expansion coefficients of the resin materials are close to each other, influences of the thermal stress on both the portions are small. Accordingly, peeling-off between the resin support portion 115A and the resin cover portion 115B is unlikely to occur. On the other hand, because the linear expansion coefficients of the piezoelectric substrate 111 and the resin support portion 115A are different from each other, a shearing force is generated in a direction parallel to the interface between the piezoelectric substrate 111 and the resin support portion 115A upon the generation of the thermal stress.

In the surface acoustic wave device 101 illustrated in FIG. 9, the dielectric film 112 is disposed between the principal surface 111M of the piezoelectric substrate 111 and the resin support portion 115A. An adhesion force of the dielectric film 112 with respect to the piezoelectric substrate 111 is weak. Accordingly, if the above-mentioned shearing force is generated, peeling-off is likely to occur between the piezoelectric substrate 111 and the dielectric film 112. This results in a problem that, in the package structure of the surface acoustic wave device 101, it is difficult to maintain the interior in the airtight condition.

SUMMARY OF THE INVENTION

Preferred embodiments of the present invention provide a surface acoustic wave device that significantly reduces or prevents peeling-off between a piezoelectric substrate and a resin member and maintains an interior in an airtight condition even when thermal stress is generated between the piezoelectric substrate and the resin member in an atmosphere subjected to temperature variations.

A preferred embodiment of the present invention provides a surface acoustic wave device including a piezoelectric substrate, a dielectric film disposed on a principal surface of the piezoelectric substrate, IDT electrodes disposed on the piezoelectric substrate with a dielectric film interposed therebetween, and a resin member disposed on the piezoelectric substrate in a state spaced from the IDT electrodes and covering the IDT electrodes, wherein the surface acoustic wave device includes a resin contact region where the piezoelectric substrate and the resin member are in direct contact with each other, and the resin contact region surrounds the IDT electrodes.

Preferably, the surface acoustic wave device further includes junction electrodes disposed on the principal surface of the piezoelectric substrate to provide electrical connection to the IDT electrodes, and via conductors disposed at least in the resin member to provide electrical connection to the junction electrodes, wherein, when looking at, in a projection view, the surface acoustic wave device from a side facing the principal surface of the piezoelectric substrate, the via conductors are present at positions overlapping the junction electrodes, but not overlapping the dielectric film.

Preferably, the resin member includes a resin support portion disposed in a state surrounding the IDT electrodes, and a resin cover portion disposed on the resin support portion in a state spaced from the IDT electrodes and covering the IDT electrodes, wherein, when looking at, in a projection view, the surface acoustic wave device from a side facing the principal surface of the piezoelectric substrate, the resin support portion is present at a position not overlapping the dielectric film.

Preferably, the resin contact region has a shape of a closed frame.

A surface acoustic wave device according to a preferred embodiment of the present invention includes the resin contact region where the piezoelectric substrate and the resin member are in direct contact with each other. Furthermore, the resin contact region surrounds the IDT electrodes. Since the resin member exhibits a stronger adhesion force with respect to the piezoelectric substrate than the dielectric film, the adhesion force of the resin member with respect to the piezoelectric substrate is increased in the surface acoustic wave device according to a preferred embodiment of the present invention than in the case of the dielectric film being interposed therebetween, i.e., in the surface acoustic wave device disclosed in the above description of "Background Art". Thus, even when the surface acoustic wave device is placed in environments subjected to temperature variations, peeling-off between the piezoelectric substrate and the resin member is able to be significantly reduced or prevented, and the interior is able to be maintained in an airtight condition.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
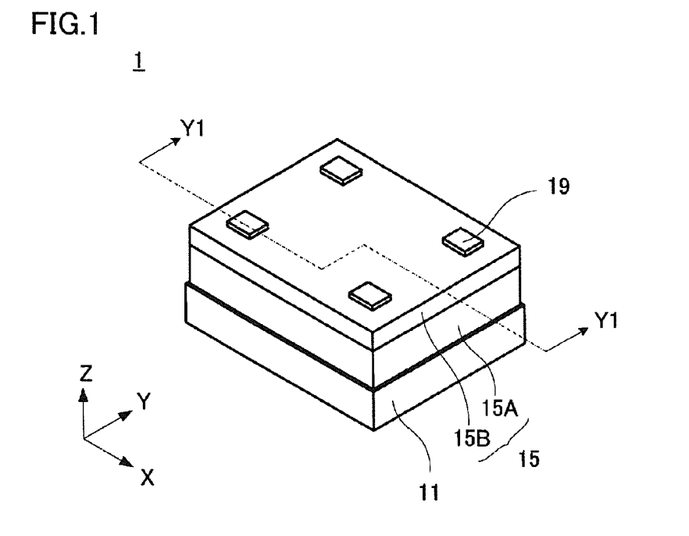
FIG. 1 is a perspective view of a surface acoustic wave device 1 according to a preferred embodiment of the present invention.
Figure 2A:
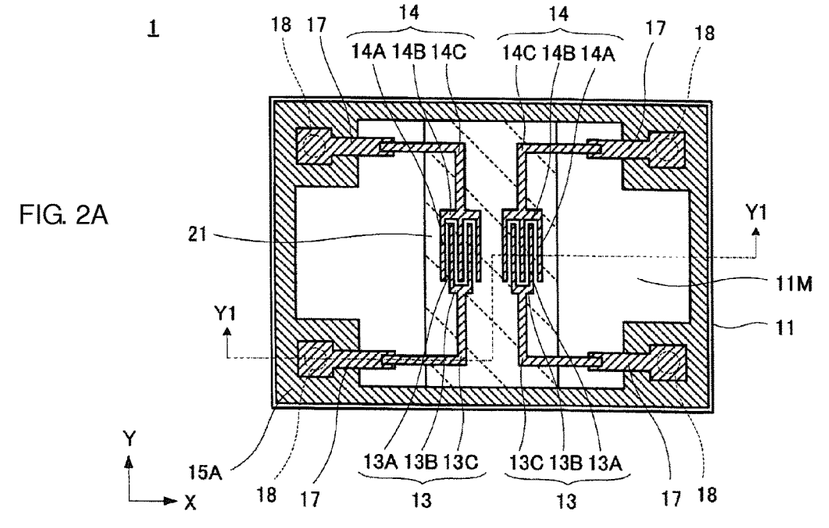
FIG. 2A is a sectional view of the surface acoustic wave device 1 taken along Z1-Z1 denoted in FIG. 2B.
Figure 2B:
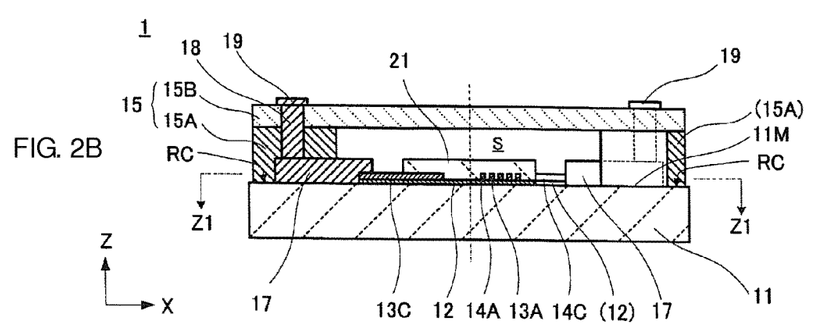
FIG. 2B is a sectional view of the surface acoustic wave device 1 taken along Y1-Y1 denoted in FIG. 1.

As illustrated in FIGS. 1, 2A and 2B, a surface acoustic wave device 1 according to a preferred embodiment includes a piezoelectric substrate 11, a dielectric film 12, IDT (Inter Digital Transducer) electrodes 13 and 14, and a resin member 15. A surface acoustic wave element preferably includes the piezoelectric substrate 11, the dielectric film, and the IDT electrodes 13 and 14. The resin member 15 preferably includes a resin support portion 15A and a resin cover portion 15B. As the resin member 15, the resin support portion 15A and the resin cover portion 15B may be an integral unitary member made of a same material. The surface acoustic wave device 1 may further include junction electrodes 17 and via conductors 18.

The surface acoustic wave device 1 has a package structure in which the piezoelectric substrate 11 and the resin member 15 define an outer periphery. With the package structure, an inner space S is sealed and maintained in an airtight condition. As described above, in an environment subjected to temperature variations, thermal stress is generated in the surface acoustic wave device 1 between the piezoelectric substrate 11 and the resin member 15. The surface acoustic wave device 1 according to the present preferred embodiment has a structure that the piezoelectric substrate 11 and the resin member 15 are difficult to peel off even when the thermal stress is generated.

The term "temperature variations" used herein implies, for example, temperature variations in a heat cycle test that is defined in JEDJESD 22-A104C specified by JEDEC (Solid State Technology Association).

The structure of the surface acoustic wave device 1 will be described below with reference to FIGS. 1, 2A and 2B.

The piezoelectric substrate 11 is a base member of the surface acoustic wave device 1. The piezoelectric substrate 11 is made of an inorganic piezoelectric material that is, e.g., lithium niobate, potassium niobate, lithium tantalate, quartz, langasite, zinc oxide, lead zirconate titanate, or lithium tetraborate. A 127° rotated Y cut X SAW propagation $LiNbO_3$ is preferably used in the present preferred embodiment, for example.

The dielectric film 12 is disposed on a principal surface 11M of the piezoelectric substrate 11, and it has a predetermined pattern. The dielectric film 12 is a film that adjusts a fractional bandwidth of the surface acoustic wave device 1. The dielectric film 12 is disposed at least between the principal surface 11M of the piezoelectric substrate 11 and the IDT electrodes 13 and 14 (see a left half of the sectional view illustrated in FIG. 2B). It is to be noted that a pattern of the dielectric film 12 is not always required to be the same as patterns of the IDT electrodes 13 and 14, and that the dielectric film 12 may be disposed on the principal surface 11M of the piezoelectric substrate 11 in a larger area than the patterns of the IDT electrodes 13 and 14 (see a right half of the sectional view illustrated in FIG. 2B).

The dielectric film 12 preferably is first formed over the entirety of the principal surface 11M of the piezoelectric substrate 11 by an ordinary film-forming process, e.g., a sputtering or CVD. The dielectric film 12 is then formed into a predetermined pattern through the steps of patterning a photoresist, and removing portions of the dielectric film 12 having been formed over the entire principal surface 11M by a proper etching process, such as dry etching or wet etching. By using the IDT electrodes 13 and 14 as masks when the dielectric film 12 is removed, the dielectric film 12 can be formed in the same shape as the patterns of the IDT electrodes 13 and 14. A thickness of the dielectric film 12 preferably is, e.g., about 0.01 μm. A material of the dielectric film 12 is a metal oxide or a metal nitride. For example, $SiO_2$, $Si_3N_4$, SiON, SiO, $Ta_2O_5$, $TiO_2$, TiN, AlN, $Al_2O_3$, or $TeO_2$ is used.

The IDT electrodes 13 and 14 are disposed on the piezoelectric substrate 11 with the dielectric film 12 disposed therebetween. The IDT electrodes 13 and 14 include respectively pluralities of electrode fingers 13A and 14A arrayed in the propagation direction (X-direction) of a surface acoustic wave, bus bars 13B and 14B connected respectively to the pluralities of electrode fingers 13A and 14A, and lead-out portions 13C and 14C connected respectively to the bus bars 13B and 14B. The electrode fingers 13A and 14A are alternately arrayed in the propagation direction of the surface acoustic wave.

The IDT electrodes 13 and 14 preferably are each made of a multilayer film that is formed by laminating a NiCr layer, a Pt layer, a Ti layer, an AlCu layer, and a Ti layer in the mentioned order. The IDT electrodes 13 and 14 preferably are each formed by patterning the multilayer film, which has been obtained with a thin film-forming method, through a lift-off process. Each of the IDT electrodes 13 and 14 preferably has a thickness of about 0.2 μm, for example. The IDT electrodes 13 and 14 preferably are each formed to provide a wavelength of, e.g., about 1.9 μm, and to have a metallization ratio of, e.g., about 0.5. A pair of reflectors (not illustrated) may be provided on both sides of the IDT electrodes 13 and 14 in the propagation direction of the surface acoustic wave.

The resin support portion 15A of the resin member 15 is disposed at the outer peripheral side of the principal surface 11M of the piezoelectric substrate 11. The resin support portion 15A preferably has a closed frame shape and preferably continuously surrounds the IDT electrodes 13 and 14. A thickness of the resin support portion 15A is larger than a total value of the thickness of the dielectric film 12 and the thickness of each of the IDT electrodes 13 and 14. A material of the resin support portion 15A is, for example, a polyimide-based resin, an epoxy-based resin, an acrylic resin, a silicon-based resin, or a benzocyclobutene resin.

The resin cover portion 15B of the resin member 15 is disposed on the resin support portion 15A such that the resin cover portion 15B is spaced from the IDT electrodes 13 and 14 through a certain distance and it covers the IDT electrodes 13 and 14. More specifically, the resin cover portion 15B is in the form of a film and is parallel or substantially parallel to the principal surface 11M of the piezoelectric substrate 11 in contact with the resin support portion 15A. With such an arrangement, the space S enclosed by the piezoelectric substrate 11 and the resin member 15 is provided in the surface acoustic wave device 1, thus allowing excitation of the surface acoustic wave in the space. A material of the resin cover portion 15B is, for example, a polyimide-based resin, an epoxy-based resin, an acrylic resin, a silicon-based resin, or a benzocyclobutene resin.

Figure 3:
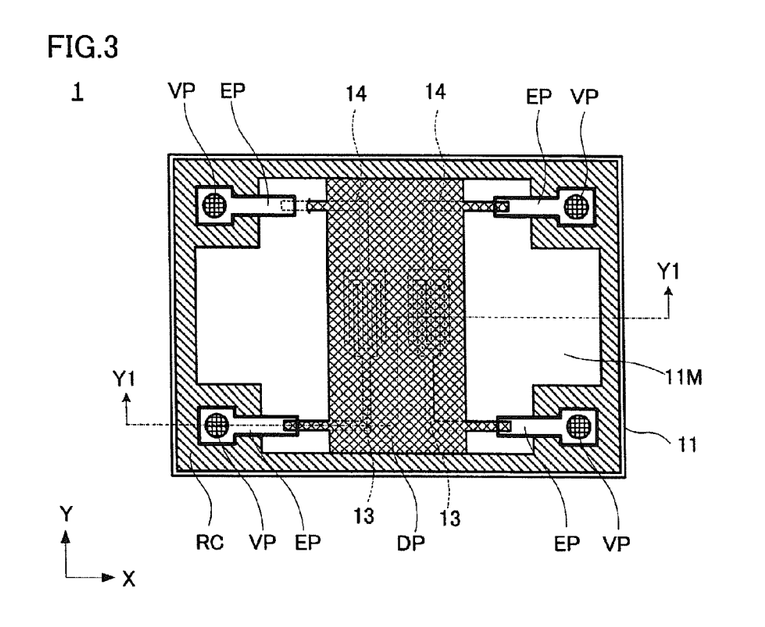
FIG. 3 is a projection view when looking at, in a projection view, the surface acoustic wave device 1 from the side facing a principal surface 11M of a piezoelectric substrate 11. Regions surrounded by solid lines represent a resin contact region RC where the piezoelectric substrate 11 and a resin member 15 are in contact with each other, projection views VP of via conductors 18, and a projection view DP of a dielectric film 12. Regions surrounded by thick solid lines represent projection views EP of junction electrodes 17. Thin broken lines represent the IDT electrodes 13 and 14.

FIG. 3 is a projection view when looking at, in a projection view, the surface acoustic wave device 1 from the side facing the principal surface 11M of the piezoelectric substrate 11. As illustrated in FIGS. 2B and 3, the surface acoustic wave device 1 includes a resin contact region RC where the piezoelectric substrate 11 and the resin member 15 are in direct contact with each other. In FIG. 3, a region hatched by oblique lines represents the resin contact region RC.

The present preferred embodiment utilizes a property such that the resin material contained in the resin member 15 exhibits an adhesion force with respect to the piezoelectric substrate 11 stronger than that exhibited by the oxide material or the nitride material contained in the dielectric film 12. Thus, in the resin contact region RC, the piezoelectric substrate 11 and the resin member 15 are difficult to peel off even when a shearing force acts between the piezoelectric substrate 11 and the resin member 15. In addition, the resin contact region RC preferably has a closed frame shape surrounding the IDT electrodes 13 and 14. Therefore, a fluid (gas or liquid) is prevented from coming into or going out through a boundary between the piezoelectric substrate 11 and the resin member 15, and the airtight condition in the interior of the package structure is able to be maintained.

Because the resin support portion 15A and the resin cover portion 15B preferably are both made of the resin materials and respective values of the linear expansion coefficients of the resin materials are the same or similar to each other, an adhesion force between both the portions is strong. Accordingly, peeling-off between the resin support portion 15A and the resin cover portion 15B is difficult to occur.

The junction electrodes 17 are disposed on the principal surface 11M of the piezoelectric substrate 11 to provide electrical connection between the IDT electrodes 13 and 14 and the via conductors 18. The junction electrodes 17 preferably are each a multilayer film that is formed by laminating an AlCu layer and a Ti layer, for example. The junction electrodes 17 are also preferably formed by patterning the multilayer film, which has been obtained with a thin film-forming method, through a lift-off process. For the reason that the electrical resistance of a wiring line for routing is preferably as small as possible, each of the junction electrodes 17 has a larger thickness than each of the IDT electrodes 13 and 14. In practice, the thickness of the junction electrode 17 preferably is about 2.5 μm, for example.

The via conductors 18 each penetrate through the resin member 15 in a thickness direction thereof. Respective first ends of the via conductors 18 are electrically connected to corresponding ones of the IDT electrodes 13 and 14 through the junction electrodes 17. Respective second ends of the via conductors 18 are exposed to an outer surface of the resin cover portion 15B and are connected to external terminals 19. The via conductors 18 are each made of at least one general metal, such as Al, Pt, Cu, Au, Ti, Ni, Cr, W, Ag, Pd, Co or Mn. In the present preferred embodiment, the via conductor 18 is formed, for example, as a multilayer film of Ni and Au by an electrolytic plating method. The via conductor 18 may be formed by fully filling a via hole with a conductor, or may have a hollow structure in which the via hole is partially filled with a conductor while a vacancy is left in its portion.

The positional relationship among the via conductors 18, the junction electrodes 17, and the dielectric film 12 in the surface acoustic wave device 1 is described here with reference to FIGS. 2B and 3. In FIG. 3, regions denoted by cross hatching with lines extending in the X-direction and the Y-direction represent projection views VP of the via conductors 18. Regions denoted by cross hatching with lines extending at an angle of 45° relative to the X-direction and the Y-direction represent a projection view DP of the dielectric film 12. Regions surrounded by thick solid lines represent projection views EP of the junction electrodes 17. As illustrated in FIG. 3, when looking at, in a projection view, the surface acoustic wave device 1 from the side facing the principal surface 11M of the piezoelectric substrate 11, the via conductors 18 are disposed at positions overlapping the junction electrodes 17, but not overlapping the dielectric film 12.

When the surface acoustic wave device 1 is placed in an environment subjected to temperature variations, the via conductors 18 containing metals are each expanded or contracted in an axial direction (Z-direction), whereupon thermal stress is generated parallel or substantially parallel to the axial direction of the via conductor 18. When the dielectric film 112 is present between the piezoelectric substrate 111 and the resin support portion 115A as illustrated in FIG. 9 in the above description of "Background Art", the adhesion force of the dielectric film 112 with respect to the piezoelectric substrate 111 is weak, thus resulting in a possibility that the piezoelectric substrate 111 and the resin support portion 115A may be peeled off due to the thermal stress generated in the axial direction.

On the other hand, in the surface acoustic wave device 1 according to the present preferred embodiment, as illustrated in FIGS. 2B and 3, the dielectric film 12 is not present in the axial direction of the via conductor 18, and the junction electrode 17 is present in that direction. Furthermore, the junction electrode 17 is in direct contact with the piezoelectric substrate 11 and is firmly held in a close contact state. Accordingly, even when the thermal stress is generated parallel or substantially parallel to the axial direction of the via conductor 18, the piezoelectric substrate 11 and the junction electrode 17 are difficult to peel off, and the piezoelectric substrate 11 and the resin support portion 15A are also difficult to peel off. As a result, the airtight condition in the interior of the surface acoustic wave device 1 is able to be maintained. Moreover, since the adhesion force in the axial direction of the via conductor 18 is strong, breaks are able to be significantly reduced or prevented in the interconnections through the via conductors 18, the junction electrodes 17, and the IDT electrodes 13 and 14.

In the surface acoustic wave device 1, a characteristic compensating dielectric portion 21 may be disposed in a state covering the IDT electrodes 13 and 14. The characteristic compensating dielectric portion 21 has a compensation function such that frequency characteristics are not significantly changed even when the temperature of the surface acoustic wave device 1 is changed. The characteristic compensating dielectric portion 21 preferably is formed by a bias sputtering method, for example, and it has a thickness of about 0.7 μm, for example. A material of the characteristic compensating dielectric portion 21 is preferably the same as that of the dielectric film 12. When the materials of the characteristic compensating dielectric portion 21 and the dielectric film 12 are the same, patterning of the characteristic compensating dielectric portion 21 and the dielectric film 12 can be performed by forming a resist on the characteristic compensating dielectric portion 21, and by etching the characteristic compensating dielectric portion 21 and the dielectric film 12 at the same time.

The surface acoustic wave device 1 according to the present preferred embodiment includes the resin contact region RC where the piezoelectric substrate 11 and the resin member 15 are in direct contact with each other. Furthermore, the resin contact region RC preferably has a closed frame surrounding the IDT electrodes 13 and 14. Since the resin member 15 exhibits a stronger adhesion force with respect to the piezoelectric substrate 11 than the dielectric film 12, the adhesion force of the resin member 15 with respect to the piezoelectric substrate 11 is increased in the surface acoustic wave device 1 according to the present preferred embodiment than in the case of the dielectric film 12 being interposed therebetween, i.e., in the surface acoustic wave device 101 disclosed in the above description of "Background Art". Thus, even when the surface acoustic wave device 1 is placed in the environment subjected to temperature variations, the peeling-off between the piezoelectric substrate 11 and the resin member 15 is significantly reduced or prevented.

Moreover, in the surface acoustic wave device 1, when looking at, in a projection view, the surface acoustic wave device 1 from the side facing the principal surface 11M of the piezoelectric substrate 11, it is preferable that the via conductors 18 are present at positions overlapping the junction electrodes 17, but not overlapping the dielectric film 12. In other words, the junction electrodes 17 are preferably present in the axial direction of the via conductors 18 instead of the dielectric film 12. As a result, even when the thermal stress is generated parallel or substantially parallel to the axial direction of the via conductors 18, the piezoelectric substrate 11 and the junction electrodes 17 are difficult to peel off, and the piezoelectric substrate 11 and the resin member 15 are also difficult to peel off.

In addition, in the surface acoustic wave device 1, when looking at, in a projection view, the surface acoustic wave device 1 from the side facing the principal surface 11M of the piezoelectric substrate 11, the resin support portion 15A is preferably present at a position not overlapping the dielectric film 12 for the following reason. The resin support portion 15A exhibits a stronger adhesion force with respect to the piezoelectric substrate 11 than the dielectric film 12. Accordingly, adhesion strength with respect to the piezoelectric substrate 11 is increased in the entirety of the device by increasing an area in which the piezoelectric substrate 11 and the resin support portion 15A are in direct contact with each other.

In the present preferred embodiment, the positions, the shapes, etc. of the dielectric film 12, the IDT electrodes 13 and 14, the junction electrodes 17, and the via conductors 18 can be modified optionally. FIGS. 4A and 4B to 6A and 6B illustrate typical modifications. Those modifications will be described below. It is to be noted that components common to those of the surface acoustic wave device 1 illustrated in FIGS. 2A and 2B are denoted by the same reference signs in FIGS. 4A to 6B and description of those components is omitted here.

Figure 4A:
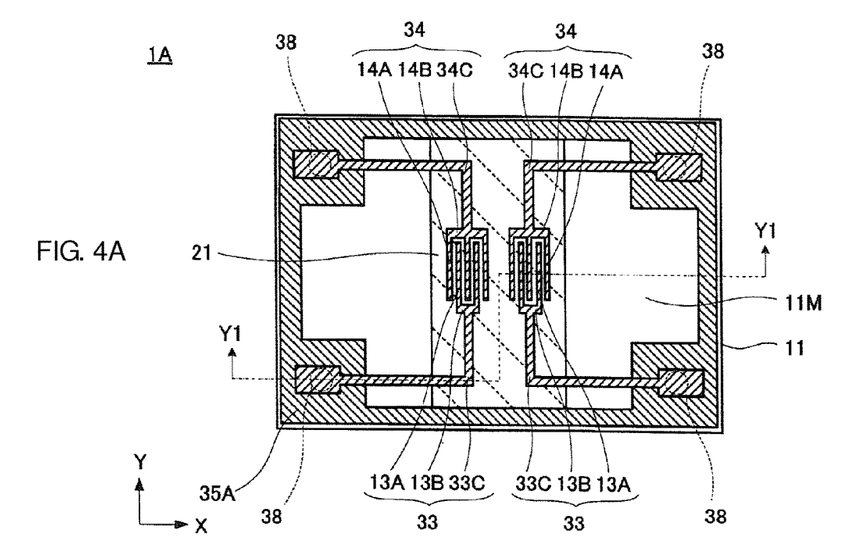
FIGS. 4A and 4B illustrate a first modification of a preferred embodiment of the present invention related to the dielectric film 12 and the IDT electrodes 13 and 14 of the surface acoustic wave device 1.
Figure 4B:
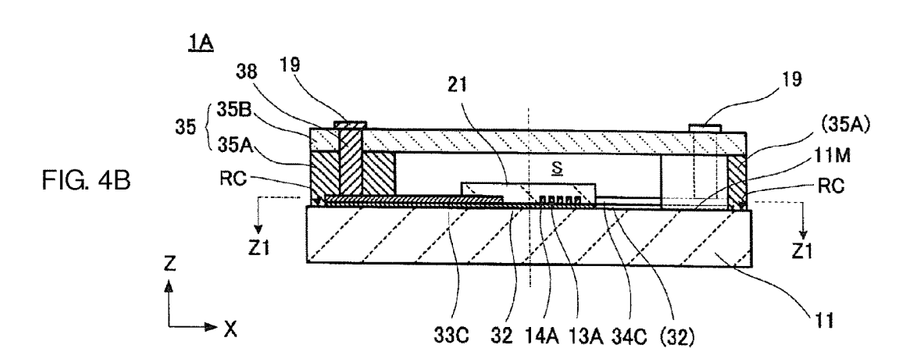

A surface acoustic wave device 1A illustrated in FIGS. 4A and 4B represents a first modification of the surface acoustic wave device 1. In the surface acoustic wave device 1A according to the first modification, the junction electrodes 17 are omitted, via conductors 38 are connected to IDT electrodes 33 and 34, a dielectric film 32 and the IDT electrodes 33 and 34 are partially buried and sandwiched between the piezoelectric substrate 11 and a resin support portion 35A, and the IDT electrodes 33 and 34 include lead-out portions 33C and 34C connected respectively to the bus bars 13B and 14B. With the junction electrodes 17 being omitted, the number of components is reduced.

The surface acoustic wave device 1A according to the first modification also includes a resin contact region RC where the piezoelectric substrate 11 and a resin member 35 are in direct contact with each other, and the resin member 35 includes the resin support portion 35A and a resin cover portion 35B. Furthermore, the resin contact region RC has the closed frame shape surrounding the IDT electrodes 33 and 34. As a result, even when the surface acoustic wave device 1A is placed in the environment subjected to temperature variations, peeling-off between the piezoelectric substrate 11 and the resin member 35 is significantly reduced or prevented.

Figure 5A:
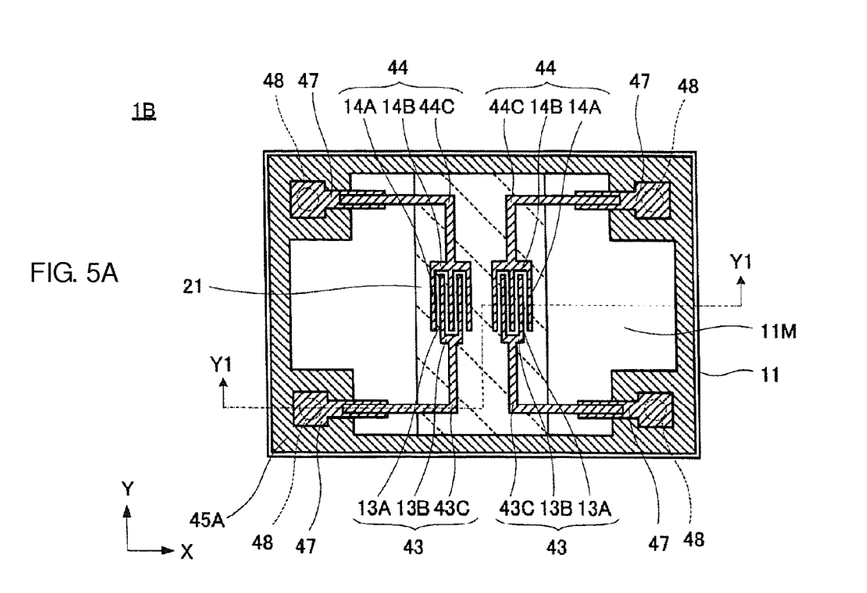
FIGS. 5A and 5B illustrate a second modification of a preferred embodiment of the present invention related to the junction electrodes 17 and the via conductors 18 of the surface acoustic wave device 1.
Figure 5B:
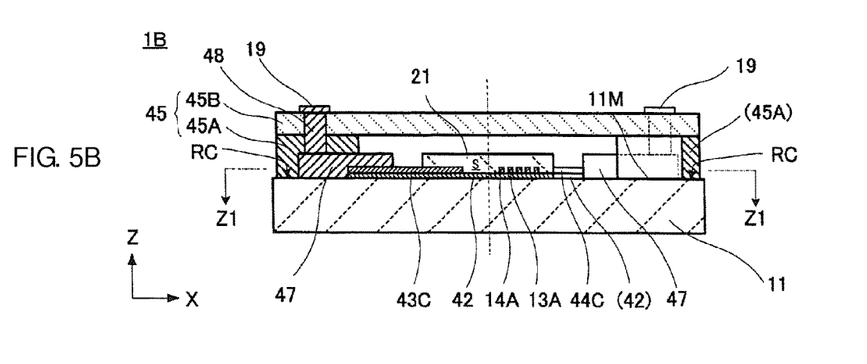

A surface acoustic wave device 1B illustrated in FIGS. 5A and 5B represents a second modification of the surface acoustic wave device 1. In the surface acoustic wave device 1B according to the second modification, a dielectric film 42 and IDT electrodes 43 and 44 are partially buried and sandwiched between the piezoelectric substrate 11 and a resin support portion 45A, and the IDT electrodes 43 and 44 include lead-out portions 43C and 44C connected respectively to the bus bars 13B and 14B.

The surface acoustic wave device 1B according to the second modification also includes a resin contact region RC where the piezoelectric substrate 11 and a resin member 45 are in direct contact with each other, and the resin member 45 includes the resin support portion 45A and a resin cover portion 45B. Furthermore, the resin contact region RC has the closed frame shape surrounding the IDT electrodes 43 and 44. As a result, even when the surface acoustic wave device 1B is placed in the environment subjected to temperature variations, peeling-off between the piezoelectric substrate 11 and the resin member 45 is significantly reduced or prevented. Moreover, when looking at, in a projection view, the surface acoustic wave device 1B from the side facing the principal surface 11M of the piezoelectric substrate 11, via conductors 48 are present at positions overlapping junction electrodes 47, but not overlapping the dielectric film 42. As a result, even when thermal stress is generated parallel or substantially parallel to an axial direction of the via conductors 48, the piezoelectric substrate 11 and the junction electrodes 47 are difficult to peel off, and the piezoelectric substrate 11 and the resin member 45 are also difficult to peel off.

Figure 6A:
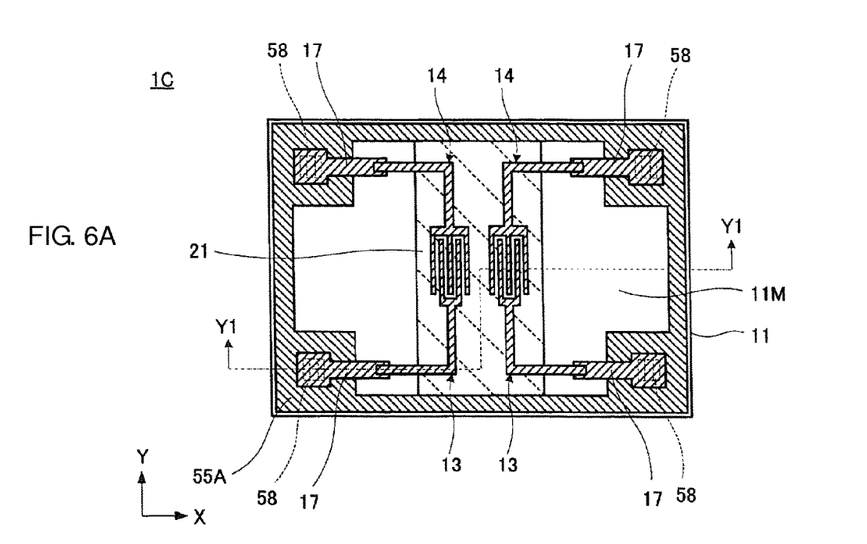
FIGS. 6A and 6B illustrate a third modification of a preferred embodiment of the present invention related to the via conductors 18 of the surface acoustic wave device 1.
Figure 6B:
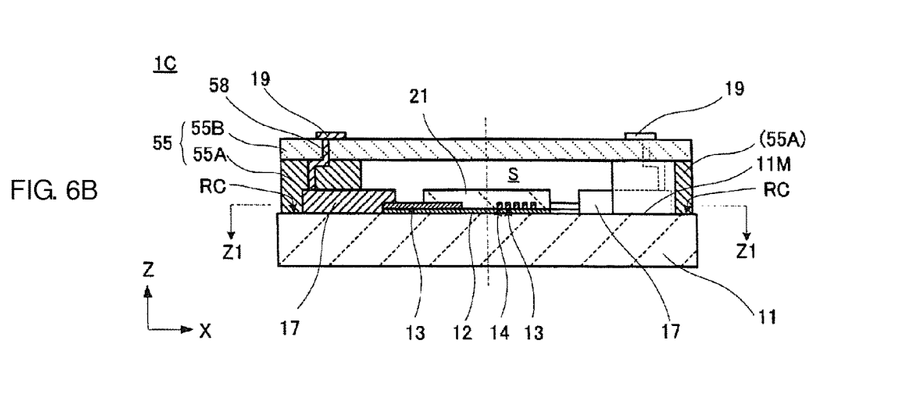

A surface acoustic wave device 1C illustrated in FIGS. 6A and 6B represents a third modification of the surface acoustic wave device 1. In the surface acoustic wave device 1C according to the third modification, via conductors 58 are each formed in a stepped shape. More specifically, as illustrated in FIG. 6B, the via conductor 58 is formed such that one end of the via conductor 58 is connected to the junction electrode 17, an intermediate portion of the via conductor 58 extends in the X-direction along a surface of a resin support portion 55A, and the remaining portion of the via conductor 58 penetrates through a resin cover portion 55B. With the above-mentioned structure, the positions of the external terminals 19 is able to be easily changed in design.

The surface acoustic wave device 1C according to the third modification also includes a resin contact region RC where the piezoelectric substrate 11 and a resin member 55 are in direct contact with each other. Furthermore, the resin contact region RC has the closed frame shape surrounding the IDT electrodes 13 and 14. As a result, even when the surface acoustic wave device 1C is placed in the environment subjected to temperature variations, peeling-off between the piezoelectric substrate 11 and the resin member 55 is significantly reduced or prevented. Moreover, when looking at, in a projection view, the surface acoustic wave device 1C from the side facing the principal surface 11M of the piezoelectric substrate 11, the via conductors 58 are present at positions overlapping the junction electrodes 17, but not overlapping the dielectric film 12. As a result, even when thermal stress is generated parallel or substantially parallel to the Z-direction of the via conductors 58, the piezoelectric substrate 11 and the junction electrodes 17 are difficult to peel off, and the piezoelectric substrate 11 and the resin member 55 are also difficult to peel off.

Figure 7:
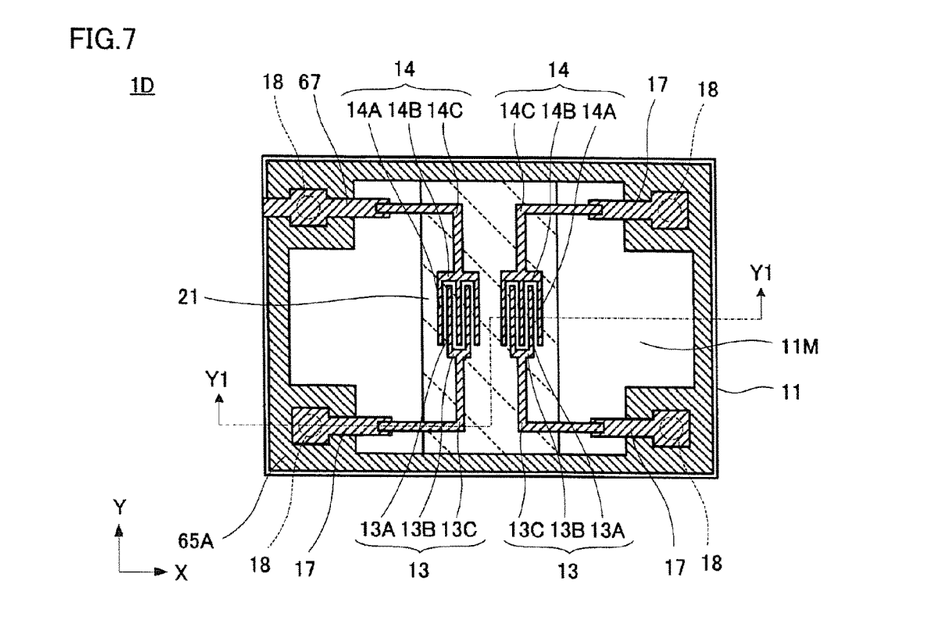
FIG. 7 illustrates a fourth modification of a preferred embodiment of the present invention related to a resin support portion 15A of the surface acoustic wave device 1.

While, in the above preferred embodiments, the resin support portion preferably has a closed frame shape surrounding the IDT electrodes, the resin support portion is not always required to be closed. For example, as in a surface acoustic wave device 1D according to a fourth modification illustrated in FIG. 7, a junction electrode 67 may extend up to an end surface of the substrate, and a resin support portion 65A may be partially opened at an extended end of the junction electrode 67. Even with such a structure, airtightness is able to maintained satisfactorily.

The above preferred embodiments are not intended to limit the present invention defined in the claims, and they can be variously modified without departing from the scope within which equivalence of the technical concept is recognized. For example, the resin support portion and the resin cover portion may be disposed as an integral unit on the substrate instead of being separate members. Moreover, the surface acoustic wave device may be fabricated through the steps of forming a plurality of surface acoustic wave devices on a parent substrate, and then dividing the parent substrate into individual pieces.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substrate;
   a dielectric film located on a principal surface of the piezoelectric substrate;
   IDT electrodes located on the piezoelectric substrate with the dielectric film interposed therebetween; and
   a resin member located on the piezoelectric substrate at a position spaced away from the IDT electrodes and covering the IDT electrodes; wherein
   the surface acoustic wave device includes a resin contact region defined by an area where the piezoelectric substrate and the resin member are in direct contact with each other;
   the resin contact region surrounds the IDT electrodes; and
   the dielectric film is in direct contact with the resin member or a junction electrode disposed on the principal surface of the piezoelectric substrate, the junction electrode providing electrical connection to the IDT electrodes.

2. The surface acoustic wave device according to claim 1, further comprising:
   junction electrodes disposed on the principal surface of the piezoelectric substrate to provide electrical connection to the IDT electrodes; and
   via conductors disposed at least in the resin member to provide electrical connection to the junction electrodes; wherein
   when looking at the surface acoustic wave device from a side facing the principal surface of the piezoelectric substrate in a projection view, the via conductors are present at positions overlapping the junction electrodes, but not overlapping the dielectric film; and
   the junction electrodes disposed on the principal surface of the piezoelectric substrate include the junction electrode disposed on the principal surface of the piezoelectric substrate.

3. The surface acoustic wave device according to claim 1, wherein the resin member comprises:
   a resin support portion that surrounds the IDT electrodes; and
   a resin cover portion disposed on the resin support portion in a state spaced away from the IDT electrodes and covering the IDT electrodes; wherein
   when looking at the surface acoustic wave device from a side facing the principal surface of the piezoelectric substrate in a projection view, the resin support portion is present at a position not overlapping the dielectric film.

4. The surface acoustic wave device according to claim 1, wherein the resin contact region has a closed frame shape.

5. The surface acoustic wave device according to claim 1, wherein the piezoelectric substrate and the resin member define an outer periphery of the surface acoustic wave device such that the surface acoustic wave device has a package structure.

6. The surface acoustic wave device according to claim 1, wherein the dielectric film adjusts a fractional bandwidth of the surface acoustic wave device.

7. The surface acoustic wave device according to claim 1, wherein the dielectric film has a same pattern as patterns of the IDT electrodes.

8. The surface acoustic wave device according to claim 1, wherein each of the IDT electrodes is a multilayer film.

9. The surface acoustic wave device according to claim 8, wherein the multilayer film includes a NiCr layer, a Pt layer, a Ti layer, an AlCu layer, and a Ti layer.

10. The surface acoustic wave device according to claim 1, wherein the dielectric film includes one of an oxide material and a nitride material.

11. The surface acoustic wave device according to claim 10, wherein an adhesion force of the resin member is stronger than an adhesion force of the one of the oxide material and the nitride material.

12. The surface acoustic wave device according to claim 5, wherein an interior of the package structure is airtight.

13. The surface acoustic wave device according to claim 2, wherein each of the junction electrodes is a multilayer film including an AlCu layer and a Ti layer.

14. The surface acoustic wave device according to claim 3, wherein an adhesion force of the resin support portion to the piezoelectric substrate is stronger than an adhesion force of the dielectric film.

15. The surface acoustic wave device according to claim 1, further comprising via conductors connected to the IDT electrodes and not comprising any junction electrodes.

16. The surface acoustic wave device according to claim 2, wherein the dielectric film and the IDT electrodes are partially buried and sandwiched between the piezoelectric substrate and the resin support portion.

17. The surface acoustic wave device according to claim 2, wherein the via conductors are step-shaped.

18. The surface acoustic wave device according to claim 17, wherein the resin member includes:
   a resin support portion that surrounds the IDT electrodes; and
   a resin cover portion disposed on the resin support portion in a state spaced away from the IDT electrodes and covering the IDT electrodes; wherein
   the via conductors include one end connected to the junction electrodes, an intermediate portion extending along a surface of the resin support portion, and a remaining portion penetrating through external terminals.

19. The surface acoustic wave device according to claim 2, wherein the resin member comprises:
   a resin support portion that only partially surrounds the IDT electrodes and is partially open at an extended end of one of the junction electrodes; and
   a resin cover portion disposed on the resin support portion in a state spaced away from the IDT electrodes and covering the IDT electrodes; wherein
   when looking at the surface acoustic wave device from a side facing the principal surface of the piezoelectric substrate in a projection view, the resin support portion is present at a position not overlapping the dielectric film.

20. The surface acoustic wave device according to claim 1, wherein at least a portion of the dielectric film is disposed between the principal surface of the piezoelectric substrate and at least a portion of the resin member.

* * * * *